(12) United States Patent
Clendenning et al.

(10) Patent No.: US 10,971,600 B2
(45) Date of Patent: *Apr. 6, 2021

(54) SELECTIVE GATE SPACERS FOR SEMICONDUCTOR DEVICES

(71) Applicant: Intel Corporation, Santa Clara, CA (US)

(72) Inventors: Scott B. Clendenning, Portland, OR (US); Szuya S. Liao, Hillsboro, OR (US); Florian Gstrein, Portland, OR (US); Rami Hourani, Portland, OR (US); Patricio E. Romero, Portland, OR (US); Grant M. Kloster, Lake Oswego, OR (US); Martin M. Mitan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,220

(22) Filed: Jul. 19, 2019

(65) Prior Publication Data

US 2020/0020786 A1  Jan. 16, 2020

Related U.S. Application Data

(63) Continuation of application No. 15/506,101, filed as application No. PCT/US2014/057585 on Sep. 26, 2014, now Pat. No. 10,396,176.

(51) Int. Cl.
*H01L 29/78* (2006.01)
*H01L 29/66* (2006.01)
(Continued)

(52) U.S. Cl.
CPC ...... *H01L 29/66545* (2013.01); *H01L 21/265* (2013.01); *H01L 21/28247* (2013.01);
(Continued)

(58) Field of Classification Search
CPC ............ H01L 29/785; H01L 29/66795; H01L 29/66545; H01L 21/265
See application file for complete search history.

(56) References Cited

U.S. PATENT DOCUMENTS

| | | | |
|---|---|---|---|
| 7,473,593 | B2 | 1/2009 | Anderson et al. |
| 7,476,578 | B1 | 1/2009 | Cheng et al. |

(Continued)

FOREIGN PATENT DOCUMENTS

| | | |
|---|---|---|
| CN | 103811535 | 5/2014 |
| JP | 2006511092 | 3/2006 |

(Continued)

OTHER PUBLICATIONS

Extended European Search Report from European Patent Application No. 14902843.3 notified May 3, 2018, 11 pgs.

(Continued)

*Primary Examiner* — Brian Turner
(74) *Attorney, Agent, or Firm* — Green, Howard & Mughal LLP

(57) ABSTRACT

Techniques related to forming selective gate spacers for semiconductor devices and transistor structures and devices formed using such techniques are discussed. Such techniques include forming a blocking material on a semiconductor fin, disposing a gate having a different surface chemistry than the blocking material on a portion of the blocking material, forming a selective conformal layer on the gate but not on a portion of the blocking material, and removing exposed portions of the blocking material.

16 Claims, 10 Drawing Sheets

(51) Int. Cl.

| | |
|---|---|
| *H01L 21/306* | (2006.01) |
| *H01L 21/304* | (2006.01) |
| *H01L 29/161* | (2006.01) |
| *H01L 29/06* | (2006.01) |
| *H01L 21/265* | (2006.01) |
| *H01L 29/423* | (2006.01) |
| *H01L 29/51* | (2006.01) |
| *H01L 29/775* | (2006.01) |
| *H01L 21/28* | (2006.01) |
| *H01L 29/49* | (2006.01) |
| *H01L 21/266* | (2006.01) |

(52) U.S. Cl.
CPC .... *H01L 29/0673* (2013.01); *H01L 29/42364* (2013.01); *H01L 29/42392* (2013.01); *H01L 29/4983* (2013.01); *H01L 29/51* (2013.01); *H01L 29/6656* (2013.01); *H01L 29/66439* (2013.01); *H01L 29/66795* (2013.01); *H01L 29/775* (2013.01); *H01L 21/266* (2013.01); *H01L 29/785* (2013.01)

(56) References Cited

U.S. PATENT DOCUMENTS

| | | |
|---|---|---|
| 8,809,920 B2 | 8/2014 | Khakifirooz et al. |
| 10,396,176 B2 | 8/2019 | Clendenning et al. |
| 2002/0072185 A1 | 6/2002 | Chen |
| 2005/0126908 A1 | 6/2005 | Keenan |
| 2005/0146934 A1 | 7/2005 | Forbes et al. |
| 2007/0158763 A1 | 7/2007 | Anderson et al. |
| 2009/0017584 A1 | 1/2009 | Cheng et al. |
| 2011/0024794 A1 | 2/2011 | Ko et al. |
| 2011/0198673 A1 | 8/2011 | Bonser et al. |
| 2012/0043593 A1* | 2/2012 | Zhong ............. H01L 21/823828 257/288 |
| 2012/0149200 A1 | 6/2012 | Culp et al. |
| 2012/0286244 A1 | 11/2012 | Chiu et al. |
| 2012/0286337 A1 | 11/2012 | Liang et al. |
| 2013/0056795 A1 | 3/2013 | Wu et al. |
| 2013/0149829 A1 | 6/2013 | Nandakumar |
| 2013/0200455 A1 | 8/2013 | Lo et al. |
| 2014/0027816 A1 | 1/2014 | Cea et al. |
| 2014/0124840 A1 | 5/2014 | Khakifirooz et al. |
| 2014/0183599 A1 | 7/2014 | Hong et al. |
| 2014/0191299 A1 | 7/2014 | Wang et al. |
| 2014/0264592 A1 | 9/2014 | Oxland et al. |
| 2014/0374827 A1* | 12/2014 | Suh ....................... H01L 29/785 257/347 |
| 2015/0137271 A1 | 5/2015 | Cai et al. |
| 2015/0179771 A1 | 6/2015 | Lo et al. |

FOREIGN PATENT DOCUMENTS

| | | |
|---|---|---|
| JP | 2009523326 | 6/2009 |
| KR | 20060027493 | 3/2006 |

OTHER PUBLICATIONS

Final Office Action from U.S. Appl. No. 15/506,101 notified Jan. 23, 2019, 10 pgs.
International Preliminary Report on Patentability from PCT/US2014/057585 notified Jun. 24, 2015, 6 pgs.
International Search Report and Written Opinion for PCT/US2014/057585 dated Jun. 24, 2015, 10 pages.
Non-Final Office Action from Japanese Patent Application No. 2017-510650 notified Apr. 10, 2019, 5 pgs.
Non-Final Office Action from Japanese Patent Application No. 2017-510650 notified Aug. 28, 2018, 8 pgs.
Non-Final Office Action from Taiwan Patent Application No. 104127166 notified Nov. 26, 2018, 11 pgs.
Non-Final Office Action from U.S. Appl. No. 15/506,101 notified Jun. 14, 2018, 27 pgs.
Notice of Allowance from Japanese Patent Application No. 2017-510650 notified Sep. 17, 2019, 2 pgs.
Notice of Allowance from Taiwan Patent Application No. 104127166 notified Jul. 3, 2019, 3 pgs.
Notice of Allowance from U.S. Appl. No. 15/506,101 notified Apr. 15, 2019, 8 pgs.
Colinge, J.P., "Multi-gate SOI MOSFETs", Tyndall National Institute, Lee Maltings, Prospect Row, Cork, Ireland, and Dept. of Electrical Engineering, university of California, Davis, CA, USA, 2007, 6 pgs.
Examination Report from Malaysian Patent Application No. PI2017700624 notified Apr. 15, 2020, 3 pgs.
Office Action from Chinese Patent Application No. 201480081500.0 notified Mar. 2, 2020, 17 pgs.
Office Action from Chinese Patent Application No. 201480081500.0 notified Aug. 28, 2020, 18 pgs.
Office Action from Korean Patent Application No. 10-2017-7004699 notified Aug. 31, 2020, 16 pgs.
Office Action from Chinese Patent Application No. 201480081500.0 notified Dec. 29, 2020, 20 pgs.

\* cited by examiner

SELECTIVE GATE SPACERS FOR SEMICONDUCTOR DEVICES

CLAIM OF PRIORITY

This application is a continuation of, and claims priority to, U.S. patent application Ser. No. 15/506,101, filed on 23 Feb. 2017 and titled "SELECTIVE GATE SPACERS FOR SEMICONDUCTOR DEVICES", which is a National Phase Entry of, and claims priority to, PCT Application No. PCT/US14/57585, filed on 26 Sep. 2014 and titled "SELECTIVE GATE SPACERS FOR SEMICONDUCTOR DEVICES", which are incorporated herein by reference in their entireties for all purposes.

TECHNICAL FIELD

Embodiments of the invention generally relate to forming selective gate spacers and more particularly relate to providing a blocking material on a semiconductor fin such that a selectively formed gate spacer may be disposed on a subsequently formed gate, and device structures, devices, and systems formed using such techniques.

BACKGROUND

Current integrated operations for replacement gate processes in tri-gate transistor fabrication may include several steps that are complicated and make it difficult to achieve desired structures. For example, in current processes, a dielectric gate spacer material may be deposited over a sacrificial (e.g., dummy) gate as well as the fin in the source and drain contact regions of the fin. The deposition may be non-selective such that the dielectric gate spacer material is formed over desired regions (e.g., the sacrificial gate) and undesired regions (e.g., the source and drain contact regions of the fin). Subsequently, the gate spacers may be formed using a multi-step (e.g., an approximately 10-step) process to form the desired gate spacers such that the sacrificial gate may be removed and replaced and subsequent device fabrication may continue.

Such multi-step processes may be difficult, costly, and may cause damage to the fin (e.g., damage to the channel region of the fin and/or to the source/drain region of the fin) and increased defect levels and the like.

As such, there is a need to achieve simpler, less costly, and higher quality processes for forming tri-gate transistor devices. Such efforts may become critical as the demand for such devices continues to grow.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
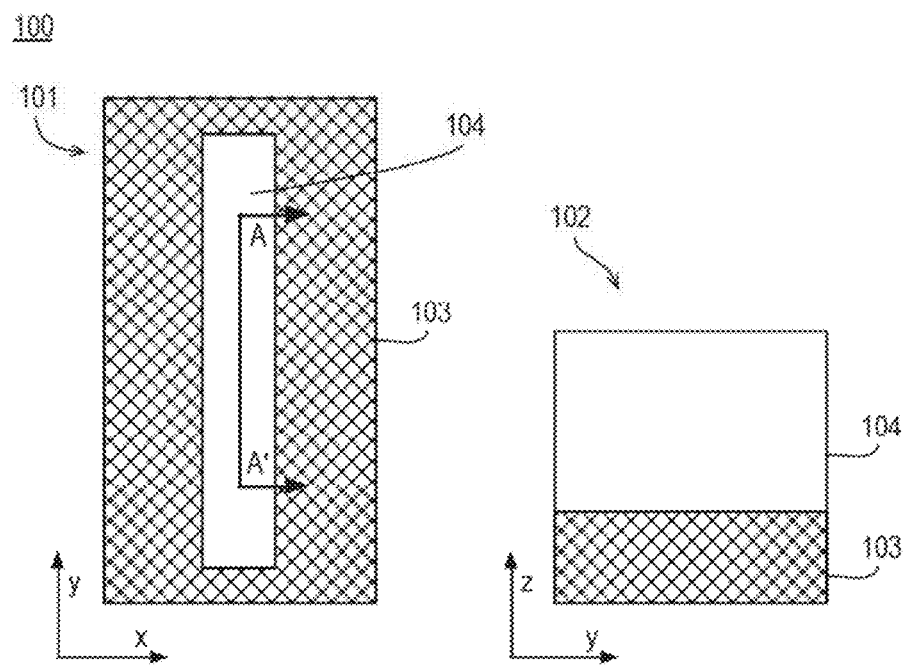
FIGS. 1A, 1B, 1C, 1D, 1E, 1F, 1G, 1H, 1I, and 1J are views of example transistor structures as particular fabrication operations are performed.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of or" one or more of can mean any combination of the listed terms. For example, the phrase "at least one of A, B or C" can mean A; B; C; A and B; A and C; B and C; or A, B and C.

Methods, device structures, devices, apparatuses, and computing platforms, are described below related to selectively formed gate sidewall spacers.

As described above, there is a need to achieve simpler, less costly, and higher quality processes for forming tri-gate transistor devices and similar devices. As is discussed further herein, in an embodiment, a blocking material may be formed on a semiconductor fin. For example, the blocking material may have a different surface chemistry than a subsequently formed gate. The blocking material may be any material having a different surface chemistry with respect to the subsequently formed gate such that a conformal layer may be formed on the gate but not on (or at least not on portions of) the blocking material. For example, the blocking material may be characterized as a cladding of the fin or the like. As discussed, a gate may be disposed on a portion of the blocking material (e.g., and over a portion of the semiconductor fin) such that, as discussed, the gate and the blocking material have different surface chemistries. In some examples, an optional implant may be performed to form an implant region within the gate to assist in the selectivity of a subsequently formed conformal layer onto the gate. Furthermore, in some examples, a blocking self-assembled monolayer may be formed on exposed portions of the blocking material. Such a blocking self-assembled monolayer may include molecules having head groups and tails, as is discussed further herein, such that the head groups attach to the blocking material and the tails further inhibit the formation of the subsequent conformal layer. In other examples, no such blocking self-assembled monolayer may be provided.

As discussed, a conformal layer having an etch selectivity with respect to the blocking material may then be selectively formed on the gate but not on at least portions of the blocking material (e.g., either including or excluding the blocking self-assembled monolayer) due to the differences in surface chemistries as discussed. For example, the conformal layer may not be formed on portions of the fin covered by the blocking material, however, a portion of the conformal layer may be formed on the fin immediately adjacent to the gate. As discussed, the gate itself may be covered by the conformal layer. In some examples, the exposed portions of the blocking material (e.g., and the blocking self-assembled monolayer if used) may be removed via an etch operation based on the etch selectivity between the blocking material and the conformal layer.

Subsequently, the top portion of the conformal layer may be removed by chemical mechanical polish (CMP) processing or the like. In some examples, the gate may be a final gate structure and, in other examples, the gate may be a sacrificial (e.g., dummy) gate. In such sacrificial gate examples, the sacrificial gate may be removed and replaced with a final gate stack such as a high-k gate dielectric and metal gate. Such a transistor structure may be used to subsequently fabricate a transistor device within an integrated circuit implementing a memory device or a logic device or the like.

For example, an integrated circuit may include a transistor formed using techniques discussed herein. Such a transistor may include a gate disposed over a portion of a semiconductor fin and a gate sidewall spacer adjacent to the gate. Furthermore, the transistor may include a blocking material between the gate sidewall spacer and the semiconductor fin such that the blocking material has an etch selectivity with respect to the gate sidewall spacer. Also, in some examples, a head or tail portion (or both) of a blocking self assembled monolayer molecule may be disposed between the blocking material and the gate sidewall spacer. In some examples, the remaining blocking material may include an implant species and/or the semiconductor fin may include an implant region at least under the blocking material. In some examples, the implant region may extend within other regions of the fin. Furthermore, the transistor may include an undercut portion under the gate sidewall spacer and within the blocking material (e.g., due to removal of adjacent portions of the blocking material). Also, the gate sidewall spacer may include a tapered or rounded portion adjacent to the fin (e.g., due to the conformal layer having limited growth adjacent to the blocking material).

The techniques discussed herein may provide a simplified fabrication process for forming gate sidewall spacers adjacent to gates disposed on semiconductor fins. Such selective gate sidewall spacer techniques may eliminate fabrication steps that would otherwise cause complication, variability in processing, and/or damage to the semiconductor fin (e g, channel regions and/or source/drain regions of the fin). Devices formed using such simplified techniques may provide enhanced performance and reduced cost of manufacture. Such transistor structures including gate sidewall spacers and a sacrificial gate may be used in a variety of process flows to fabricate a transistor device.

FIGS. 1A, 1B, 1C, 1D, 1E, 1F, 1G, 1H, 1I, and 1J are views of example transistor structures as particular fabrication operations are performed, arranged in accordance with at least some implementations of the present disclosure. FIG. 1A provides a plan view 101 and a side view 102 taken along lines A-A' in plan view 101 of an example transistor structure 100. As shown in FIG. 1A, transistor structure 100 may include a device layer 103 and a semiconductor fin 104. Device layer 103 may include, for example, a semiconductor material such as crystalline silicon. In some examples, device layer 103 may include previously formed devices, device components, or the like. For example, device layer 103 may include transistors, memories, capacitors, resistors, optoelectronic devices, switches, or any other active or passive electronic devices, or portions thereof. In some examples, device layer 103 may include a partially formed device such as a transistor device. In some examples, device layer 103 may be disposed over a substrate (not shown). In some examples, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, device layer 103 may itself comprise such substrate materials.

Semiconductor fin 104 may include any suitable semiconductor material. In an embodiment, semiconductor fin 104 includes monocrystalline silicon. In other embodiments, semiconductor fin 104 may include a semiconductor material such as germanium (Ge), silicon germanium (SiGe), a III-V materials based material (e.g., gallium arsenide (GaAs)), a silicon carbide (SiC), a sapphire ($Al_2O_3$), or any combination thereof. Semiconductor fin 104 may be formed using any suitable technique or techniques such as via a patterning and etch of device layer 103, via a sacrificial fin process, or the like. As illustrated, in some examples, semiconductor fin 104 may be a tri-gate fin disposed on device layer 103. In other examples, semiconductor fin 104 may be an undercut fin such that a portion of device layer 103 may be removed from under semiconductor fin 104 and semiconductor fin 104 may be characterized as a nanowire and transistor structures as discussed herein may be characterized as nanowire devices. In some examples, the fin structure of such a nanowire device may have a substantially circular cross section.

Figure 1B:
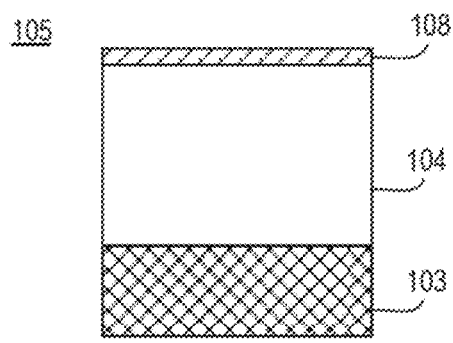

FIG. 1B illustrates a transistor structure 105 similar to transistor structure 100, after the formation of a blocking material 108 on semiconductor fin 104. Blocking material 108 may include any suitable material or material stack. For example, blocking material 108 may include one or more of silicon oxide, silicon oxynitride, silicon nitride, silicon carbide, silicon oxycarbide, or aluminum oxide. As is discussed further below, blocking material 108 may have a difference in surface chemistry with (e.g., may be chemically differentiated with) a subsequently formed gate and blocking material 108 may block or impede the formation of a conformal layer thereon. For example, the subsequently formed gate may be a sacrificial gate comprising polysilicon. Furthermore, blocking material 108 may protect semiconductor fin 104 during subsequent processing. In various examples, blocking material 108 may be characterized as a blocking layer or a cladding or the like. Blocking material 108 may be formed on a top and sidewalls of semiconductor fin 104. Furthermore, blocking material 108 may have any suitable thickness. In some examples, blocking material 108 may have a thickness in the range of 2 to 5 nm, a thickness in the range of 4 to 10 nm, or a thickness in the range of 5 to 15 nm, or the like.

Blocking material 108 may be formed using any suitable technique or techniques. In some examples, blocking material 108 may be formed via a thermal growth process. For example, blocking material 108 may include a silicon oxide ($SiO_2$) grown via thermal oxidation. In other examples, blocking material 108 may be deposited using a blanket deposition techniques such as chemical vapor deposition (CVD), plasma enhanced chemical vapor deposition (PECVD), physical vapor deposition (PVD), molecular beam epitaxy (MBE), metalorganic chemical vapor deposition (MOCVD), molecular layer deposition (MLD), atomic layer deposition (ALD), or the like.

Figure 1C:
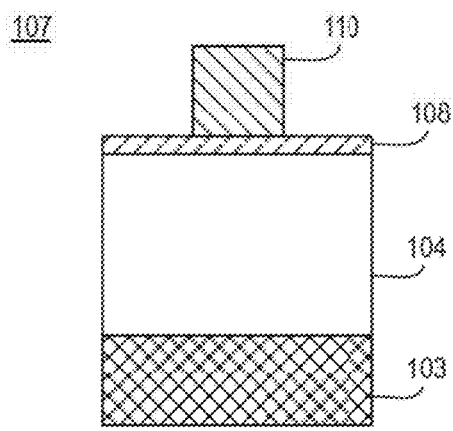

FIG. 1C illustrates a transistor structure 107 similar to transistor structure 105, after the formation of a gate 110 on a portion of blocking material 108. As shown, gate 110 may be patterned onto a portion of blocking material 108. Gate 110 may be disposed on blocking material 108 using any suitable technique or techniques. For example, gate 110 may be formed by the deposition of a bulk material and patterning using lithography techniques or the like. in some examples, gate 110 may be a sacrificial or dummy gate such that a subsequent replacement gate process may be performed to form a final gate stack. Gate 110 may include any suitable material having a difference in surface chemistry with respect to blocking material 108 as discussed herein. In some examples, gate 110 is polysilicon. In other examples, gate 110 is silicon nitride. Blocking material 108, gate 110, and other structures may wrap around three sides of semiconductor fin 104 (e.g., a top of semiconductor fin 104 as shown in FIG. 1C, and sides of semiconductor fin 104— please refer to the plan view of FIG. 1A). In some examples, gate 110 may extend across multiple semiconductor fins. In some examples, blocking material 108, gate 110, and other structures may wrap around all sides of semiconductor fin 104 such as in nanowire implementations.

Figure 1D:
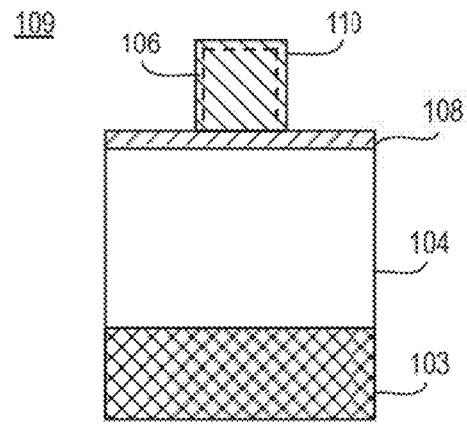

FIG. 1D illustrates a transistor structure 109 similar to transistor structure 107, after an optional implant to form an implant region 106 within gate 110. As is discussed below with respect to FIG. 1E, a selective conformal layer may be formed on gate 110. In some examples, an optional implant as illustrated may be performed prior to forming the conformal layer on gate 110. For example, the implant species may assist in the formation of the selective conformal layer on gate 110 while causing minimal damage and/or minimal change in the chemistry of implanted portions of blocking material 108 on semiconductor fin 104. For example, gate 110 may be polysilicon and blocking material 108 may be silicon oxide (e.g., a thermally grown silicon oxide) or silicon carbide or the like. In such an example, the implant species of implant region 106 may be nitrogen. Such an implant may cause the subsequent conformal layer to more selectively form on gate 110 and not on exposed portions of blocking material 108 as discussed herein. In an examples, gate 110 may be polysilicon and the implant may be an amorphization or pre-amorphization implant of the polysilicon with an implant species of silicon or nitrogen or an inert implant species such as argon, helium, or xenon, or the like. In such examples, the subsequently formed blocking material 108 (discussed further herein) may be formed by a carbon deposition and rapid thermal processing (e.g., an anneal or the like) such that blocking material 108 (and subsequently formed gate sidewall spacers) includes silicon carbide. In other examples, the subsequently formed blocking material 108 may be a thermally grown silicon oxide or the like.

As discussed, in some examples, the implant may include nitrogen, silicon, or an inert implant species such as argon, helium, or xenon. In other examples, the implant may include oxygen, boron, phosphorus, arsenic, antimony or carbon. In some examples, the implant may be performed as a blanket implant such that no patterning is performed prior to the implant. For example, implant region 106 may be provided on a top and sidewalls of gate 110 as shown and the exposed portions of the top and sidewalls of semiconductor fin 104. In some examples an implant region (not shown) may extend into blocking material 108 and/or semiconductor fin 104.

Figure 6:
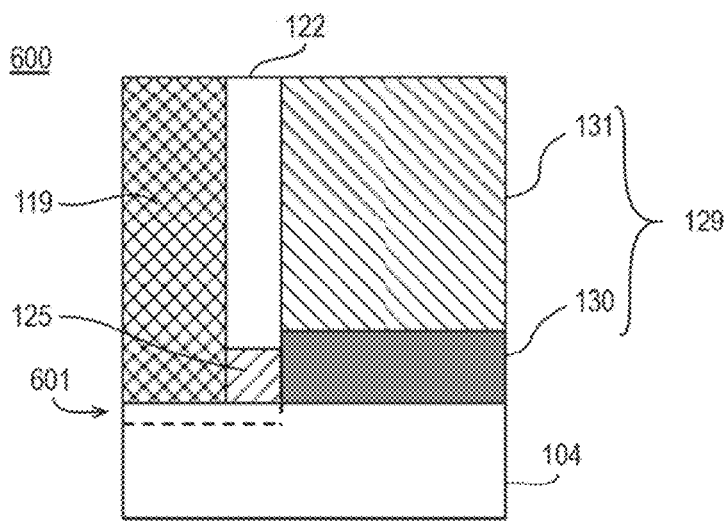
FIG. 6 illustrates an example transistor structure with an implant region.

For example, such implant regions are discussed herein with respect to FIG. 6. In some examples, portions of device layer 103 outside of semiconductor fin 104 may also include an implant region. Such an implant region or portions thereof may remain after subsequent fabrication steps and may be a part of a final transistor device or structure as discussed herein. As discussed, the implant illustrated in FIG. 1D may be optional and, in some examples, no implant may be performed. FIGS. 1E, 1F, 1G, 1H, 1I, and 1J illustrate an example embodiment without the optional implant region for the sake of clarity of presentation.

In other examples, the implant discussed with respect to FIG. 1D may be sufficient to form a conformal layer disposed on gate 110. As discussed, in some examples, blocking material 108 may include a silicon oxide, gate 110 may include polysilicon, and the implant species of implant region 106 may include nitrogen. In such examples, a selective conformal layer as discussed herein may be formed via the discussed implant and without subsequent deposition operations (or the like) as discussed with respect to FIG. 1E. Furthermore, such a selective conformal layer formed via implant may have etch selectivity with respect to blocking material 108. For example, as discussed herein, selectively forming a conformal layer on gate 110 may include implanting a species into gate 110 to form an implant region. Such processing may include an optional annealing operation or the like. In other examples, a conformal layer may be formed on gate 110 (e.g., with or without an implant region) via deposition operations or the like.

Figure 1E:
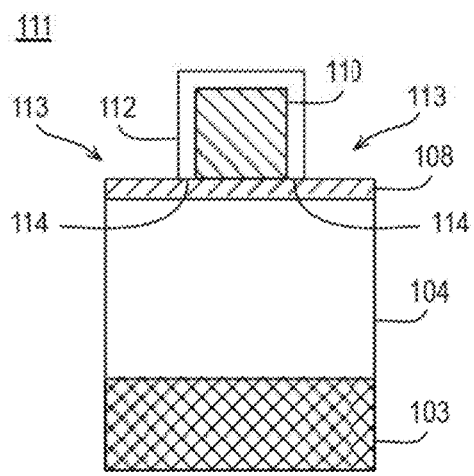

FIG. 1E illustrates a transistor structure 111 similar to transistor structure 107, after the formation of a selective conformal layer 112 on gate 110. As shown, selective conformal layer 112 may be formed on gate 110 and not on portions 113 of blocking material 108. For example, selective conformal layer 112 may be selectively formed on gate 110 and not on portions 113 of blocking material 108 due to the difference in surface chemistries between gate 110 and blocking material 108 as discussed herein. As shown, in some examples, selective conformal layer 112 may be formed on portions 114 of blocking material 108. Such portions may be covered due to the formation of selective conformal layer 112 proximal to portions 114 on gate 110 for example. In other examples, selective conformal layer 112 may not be formed on any portions of blocking material 108. In some examples, selective conformal layer 112 may include a tapered or rounded portion as is discussed further herein with respect to FIG. 5. As discussed, blocking material 108 may block or impede the formation of selective conformal layer 112 thereon. In some examples, as discussed with respect to FIGS. 2A-2F and 3, an additional blocking self-assembled monolayer may be formed on blocking material 108 to block or impede the formation of selective conformal layer 112 thereon.

Selective conformal layer 112 may include any suitable material or materials that may be formed on gate 110 and not on portions of blocking material 108 and that may have an etch selectivity with respect to blocking material 108. For example, selective conformal layer 112 may include one or more of silicon oxide, silicon nitride, silicon oxynitride, silicon carbide, silicon oxycarbide, boron nitride, boron carbide, boron carbonitride, boron phosphide, boron sulfide, polyphosphazene, or metal oxide such as aluminum oxide. Selective conformal layer 112 may have any suitable thickness. In some examples, selective conformal layer 112 may have a thickness in the range of 3 to 10 nm, a thickness in the range of 5 to 12 nm, a thickness in the range of 8 to 20 nm, or the like.

Selective conformal layer 112 may be formed using any suitable technique or techniques. In some examples, selective conformal layer 112 may be formed via a deposition using vapor phase methods such as plasma exposure, ALD, MLD, or CVD. The temperature of such a deposition may be any suitable temperature such as a temperature in the range of room temperature to 1100° C. In an example, gate 110 may include polysilicon that may be exposed to a remote nitrogen gas ($N_2$) or ammonia ($NH_3$) plasma with an optional other reactant such as hydrogen ($H_2$) and/or an optional diluting inert gas such as helium (He) or Argon (Ar) at a temperature in the range of 400 to 1100° C. for a time in the range of 1 to 600 seconds to form a selective layer of silicon nitride on gate 110. In such examples, blocking material 108 may include a silicon oxide, silicon oxynitride, silicon oxycarbide, silicon carbide or a metal oxide such as aluminum oxide, for example. In some examples, the discussed deposition may be followed by rapid thermal processing. For example, selective conformal layer 112 may be formed after a pre-amorphization implant of gate 110 such that selective conformal layer 112 may be formed by a deposition (e.g., of carbon) and rapid thermal processing (e.g., to form a silicon carbide conformal layer 112).

Furthermore, as shown, selective conformal layer 112 may be formed via a single operation such as a single deposition operation. For example, the single deposition operation may include an atomic layer deposition, a molecular layer deposition, or a chemical vapor deposition as discussed. Such a single deposition operation may provide for simplicity of manufacture and such a single deposition operation in the presence of blocking material 108 may provide for protection of semiconductor fin 104 such that high manufacturing yields and low defectivity may be achieved.

Furthermore, as discussed with respect to FIG. 1D, in some examples, selective conformal layer 112 may be formed by performing an implant into gate 110. In such examples, a portion of gate 110 may be consumed to form selective conformal layer 112. Furthermore, in such examples, a portion of blocking material 108 may remain between a subsequently formed gate sidewall spacer and a portion of semiconductor fin 104 as is discussed with respect to FIG. 1J and elsewhere herein.

Figure 1F:
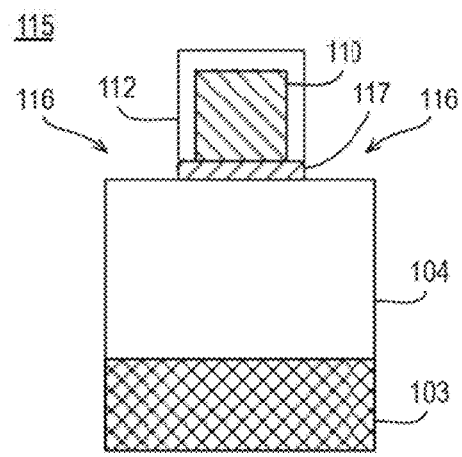

FIG. 1F illustrates a transistor structure 115 similar to transistor structure 111, after the removal of exposed portions of blocking material 108. As shown, portions of blocking material 108 may be removed to expose regions 116 of semiconductor fin 104 and to leave a remaining blocking material portion 117. Remaining blocking material portion 117 may be under gate 110 and/or under portions of selective conformal layer 112. In some examples, as is discussed further herein with respect to FIG. 4, an undercut may be formed within remaining blocking material portion 117 during the removal of portions of blocking material 108. The removed portions of blocking material 108 may be removed via any suitable technique or techniques. For example, portions of blocking material 108 may be removed via an etch process such as a wet etch process. As discussed, selective conformal layer 112 and blocking material 108 may have an etch selectivity therebetween such that an etch may be performed that removes portions of blocking material 108 while leaving selective conformal layer 112 substantially unaffected. For example, portions of blocking material 108 may be removed via a selective etch operation. Regions of the exposed portions of semiconductor fin 104 may subsequently be used for source/drain formation and/or source/drain contacts or the like. The techniques discussed herein may provide for substantially undamaged regions of semiconductor fin 104 for such structures.

Figure 1G:
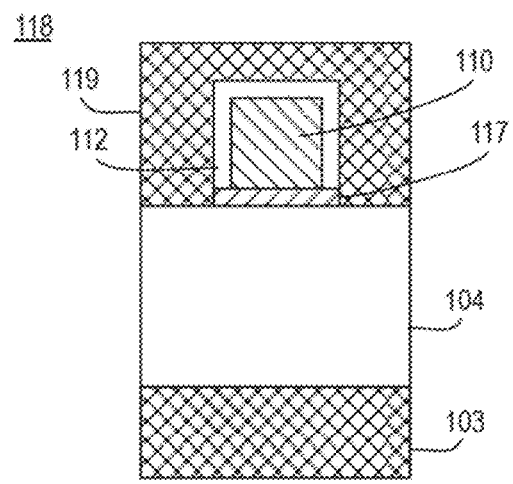

FIG. 1G illustrates a transistor structure 118 similar to transistor structure 115, after the optional formation of an interlayer dielectric material 119. As shown, interlayer dielectric material 119 may be bulk deposited using any suitable technique or techniques over semiconductor fin 104, remaining blocking material portion 117, gate 110, and selective conformal layer 112. Interlayer dielectric material 119 may include any suitable dielectric material for providing electrical insulation between devices formed on or within device layer 103 for example. In some examples, such an interlayer dielectric material 119 may not be employed or an interlayer dielectric (if used between devices) may be provided at a subsequent processing operation.

Figure 1H:
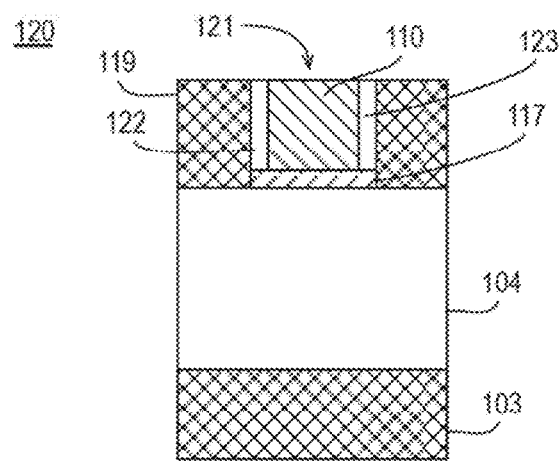

FIG. 1H illustrates a transistor structure 120 similar to transistor structure 118, after the exposure of a top 121 of gate 110 and the formation of gate sidewall spacers 122, 123. As shown, a portion of interlayer dielectric material 119 and a top of selective conformal layer 112 may be removed. The portion of interlayer dielectric material 119 and the top of selective conformal layer 112 may be removed using any suitable technique or techniques such as, for example, chemical mechanical polish (CMP) techniques. Also as shown, gate sidewall spacers 122, 123 may be formed from remaining portions of selective conformal layer 112 after the removal of a top portion of selective conformal layer 112.

As discussed, interlayer dielectric material 119 may be optional or such an interlayer dielectric may be provided later in the process flow. In such examples, top 121 of gate 110 may be exposed by the removal of a top of selective conformal layer 112 to form gate sidewall spacers 122, 123 via chemical mechanical polish (CMP) techniques or the like. In some examples, other transistor structures such as source and drain implants, extended source and drain regions may be formed with gate 110 present prior to the formation of interlayer dielectric material 119.

Figure 1I:
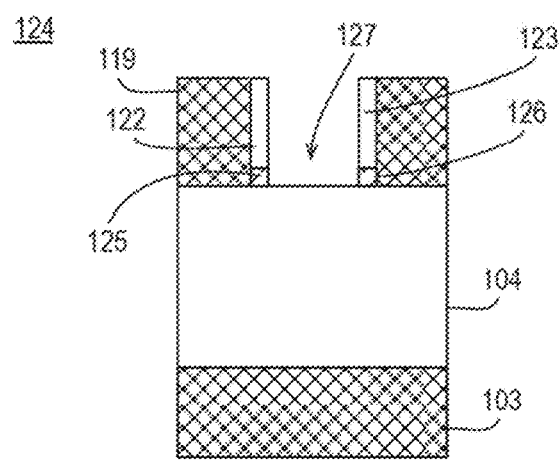

FIG. 1I illustrates a transistor structure 124 similar to transistor structure 120, after the removal of gate 110 and removal of a portion blocking material portion 117 adjacent to semiconductor fin 104 and between gate sidewall spacers 122, 123. As shown, gate 110 may be removed. In such examples, gate 110 may be a sacrificial gate or a dummy gate or the like. Furthermore, as shown, a portion of blocking material portion 117 may be removed to leave remaining blocking material 125 and remaining blocking material 126 and to expose a region 127 of semiconductor fin 104. Gate 110 may be removed using any suitable technique or technique such as etch techniques or the like. Similarly, the portion of blocking material portion 117 may be removed using any suitable technique or technique such as etch techniques or the like. In some examples, gate 110 may be removed in a first etch process and the portion blocking material portion 117 may be removed in a second etch process. In some examples, as is discussed further herein with respect to FIG. 4, an undercut may be formed within remaining blocking material 125 and/or remaining blocking material 126 during the removal of the portion blocking material portion 117.

Figure 1J:
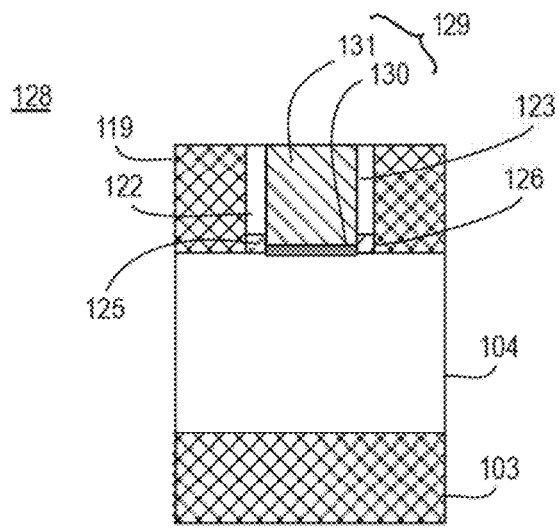

FIG. 1J illustrates a transistor structure 128 similar to transistor structure 124, after the formation of gate stack 129. As shown, gate stack 129 may be formed on semiconductor fin 104 and between gate sidewall spacers 122, 123. Gate stack 129 may include any suitable material or materials. For example, gate stack 129 may include a gate dielectric 130 such as a high-k gate dielectric and a gate electrode 131 such as a metal gate electrode. Gate stack 129 may be formed using any suitable technique or techniques such as conformal deposition, deposition, and CMP techniques or the like. As shown, in some examples, gate dielectric 130 may be formed on a surface of semiconductor fin 104. In other examples, gate dielectric 130 may also be formed on side surfaces of gate sidewall spacers 122, 123 such that gate electrode 131 is not in direct contact with gate sidewall spacers 122, 123 for example. As discussed, in some examples, gate stack 129 may wrap around three sides of semiconductor fin 104 (e.g., a top of semiconductor fin 104 as shown in FIG. 1J, and sides of semiconductor fin 104—please refer to the plan view of FIG. 1A). In some examples, gate stack 129 may wrap around all sides of semiconductor fin 104 such as in nanowire implementations.

Transistor structure 128 may form a portion of a transistor of an integrated circuit. for example, as is discussed further herein. For example, a transistor may include gate stack 129 (e.g. a gate) formed over a portion of semiconductor fin 104. The transistor may further include gate sidewall spacer 122 adjacent to the gate (e.g., adjacent to gate stack 129) and a blocking material (e.g., blocking material 125) between gate sidewall spacer 122 and another portion of semiconductor fin 104. As discussed, gate sidewall spacer 122 may be formed via disposing a selective conformal layer on sacrificial gate 110 or via performing an implant to form a selective conformal layer on sacrificial gate 110. Such a transistor structure or other transistor structures discussed herein may be implemented via a system, platform, computing device, or the like as is discussed further herein.

As discussed, FIGS. 1G-1J illustrate an example process flow for the formation of a transistor structure. In other embodiments, other fabrication operations may be performed on transistor structure 115 of FIG. 1F such as other replacement gate process flows or the like. For example, as discussed, a top of gate 110 may be exposed, sidewall spacers 122, 123 may be formed, and gate 110 may be removed without the introduction of interlayer dielectric 119. Furthermore, the formation of other structures such as channel implant regions, source/drain implant regions, and the like have not been discussed for the sake of clarity of presentation.

As discussed above with respect to FIG. 1E, a blocking self-assembled monolayer may be formed on blocking material 108 to block or impede the formation of selective conformal layer 112 thereon. Such embodiments are discussed with respect to FIGS. FIGS. 2A-2F and 3.

Figure 2A:
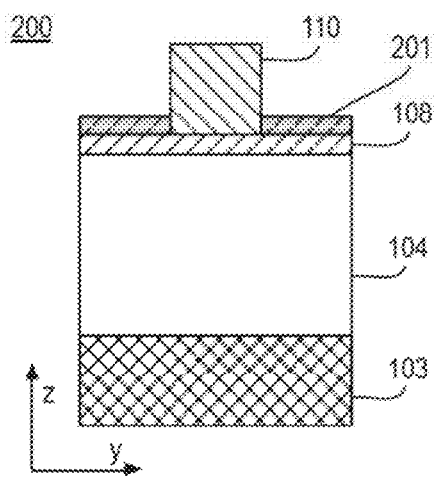
FIGS. 2A, 2B, 2C, 2D, 2E, and 2F are views of example transistor structures as particular fabrication operations are performed.

FIGS. 2A, 2B, 2C, 2D, 2E, and 2F are views of example transistor structures as particular fabrication operations are performed, arranged in accordance with at least some implementations of the present disclosure. FIG. 2A illustrates a transistor structure 200 similar to transistor structure 109, after the formation of a blocking self-assembled monolayer 201. As shown, blocking self-assembled monolayer 201 may be selectively formed on exposed portions of blocking material 108. For example, blocking self-assembled monolayer 201 may be selectively formed on exposed portions of blocking material 108 due to the discussed difference in surface chemistries between blocking material 108 and gate 110. As discussed, blocking self-assembled monolayer 201 may provide enhanced or additional blocking of the formation of a subsequent conformal layer such that the conformal layer is selectively formed on gate 110 and not on blocking self-assembled monolayer 201 to thereby increase the selectivity of the subsequently formed conformal layer onto gate 110. Blocking self-assembled monolayer 201 may include molecules having head groups, tails, and, optionally, functional tail groups and blocking self-assembled monolayer 201 may be organized onto blocking material 108 such that head groups attach to blocking material 108 and tails and optional functional tail groups extend away from blocking material 108 in substantially the z-direction illustrated in FIG. 2A. In some examples, blocking self-assembled monolayer 201 may be characterized as a passivation material or the like. Furthermore, blocking self-assembled monolayer 201 may be formed using any suitable technique or techniques. For example, blocking self-assembled monolayer 201 may be formed spontaneously on blocking material 108 via adsorption or the like. For example, blocking self-assembled monolayer 201 may be formed in a solution phase or in a vapor phase.

Figure 3:
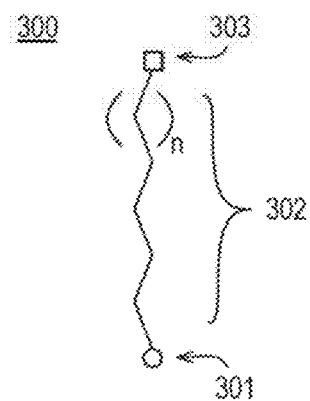
FIG. 3 illustrates an example blocking self-assembled monolayer molecule.

FIG. 3 illustrates an example blocking self-assembled monolayer molecule 300, arranged in accordance with at least some implementations of the present disclosure. As shown in FIG. 3, blocking self-assembled monolayer molecule 300 may include a head group 301, a tail 302, and, optionally, a tail functional group 303. As discussed, head group 301 may adsorb or otherwise attach to blocking material 108. Head group 301 may include any suitable functional group that may attach to blocking material 108 but not to gate 110. For example, head group 301 may include one or more of a siloxane, a silyl chloride, an alkene, an alkyne, an amine, a phosphine, a thiol, a phosphonic acid, or a carboxylic acid. Furthermore, tail 302 may include any type and number of connecting group such as 8 to 22 alkyl groups or the like. For example, blocking self-assembled monolayer molecule 300 may have a relatively long (e.g. C8-C22) alkyl chain. Furthermore, blocking self-assembled monolayer molecule 300 may include functional tail group 303. In other examples, blocking self-assembled monolayer molecule 300 may not include a functional tail group.

Returning to FIG. 2A, in some examples, blocking material 108 may be a silicon oxide (e.g., a thermal oxide having a thickness of 2 to 5 nm) as discussed herein. In an embodiment, such a silicon oxide blocking material 108 may be further passivated by the formation of a siloxane based blocking self-assembled monolayer 201. In such examples, gate 110 may be a polysilicon gate such as an H-terminated polysilicon.

As discussed herein with respect to FIG. 1D, in some examples, an optional implant may be provided to form an implant region within gate 110. Such an implant region may assist in the formation of selective conformal layer 112 or such an implant may be performed to form selective conformal layer 112. The implant region may include any implant species as discussed herein. For example, such an implant may be performed prior to or subsequent to the formation of blocking self-assembled monolayer 201 when used to assist in the formation of selective conformal layer 112. In examples where such an implant may be performed to form selective conformal layer 112, the implant may be performed subsequent to the formation of blocking self-assembled monolayer 201. Such an implant region is not illustrated in FIGS. 2A-2F for the sake of clarity of presentation.

Figure 2B:
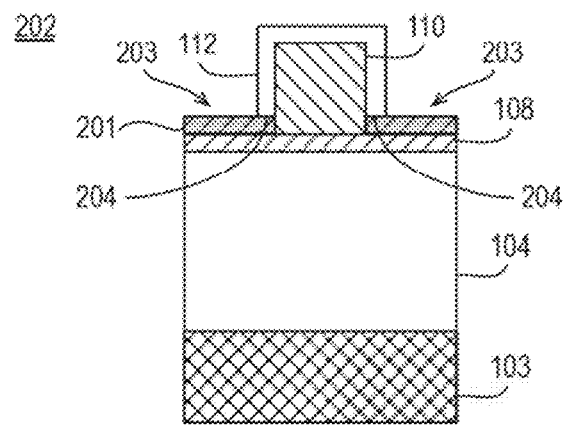

FIG. 2B illustrates a transistor structure 202 similar to transistor structure 200, after the formation of selective conformal layer 112 on gate 110. Selective conformal layer 112 may be formed in any manner and may include any materials and/or characteristics as discussed herein. Such details will not be repeated for the sake of brevity. Continuing the above example such that blocking material 108 is silicon oxide, blocking self-assembled monolayer 201 includes a siloxane based molecules and gate 110 is polysilicon, selective conformal layer 112 may be formed by a low temperature (e.g., 25 to 300° C.) ALD, MLD, or CVD process.

As shown, selective conformal layer 112 may be formed on gate 110 and not on portions 203 of blocking self-assembled monolayer 201. For example, selective conformal layer 112 may be selectively formed on gate 110 and not on portions 203 of blocking self-assembled monolayer 201 due to the difference in surface chemistries between gate 110 and blocking self-assembled monolayer 201 and/or blocking material 108 as discussed herein. As shown, in some examples, selective conformal layer 112 may be formed on portions 204 of blocking self-assembled monolayer 201. Such portions may be covered due to the formation of selective conformal layer 112 proximal to portions 204 on gate 110 for example. In other examples, selective conformal layer 112 may not be formed on any portions of blocking self-assembled monolayer 201. In such examples, selective conformal layer 112 may include a tapered or rounded portion as is discussed further herein with respect to FIG. 5. As discussed, blocking self-assembled monolayer 201 and/or blocking material 108 may block or impede the formation of selective conformal layer 112 thereon.

Figure 2C:
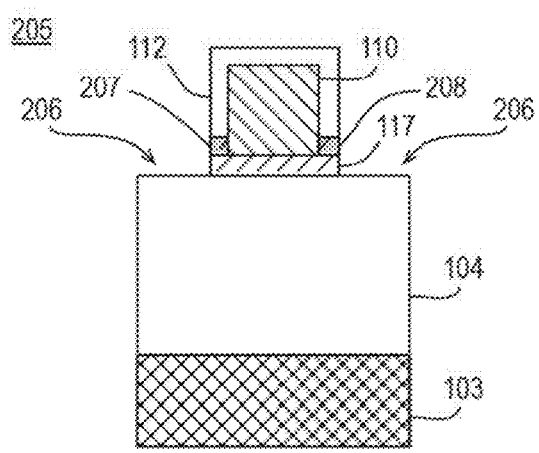

FIG. 2C illustrates a transistor structure 205 similar to transistor structure 202, after the removal of exposed portions of blocking self-assembled monolayer 201 and blocking material 108. As shown, portions of blocking self-assembled monolayer 201 and portions of blocking material 108 may be removed to expose regions 206 of semiconductor fin 104 and to leave a remaining self-assembled monolayer portions 207, 208 and remaining blocking material portion 117. Remaining self-assembled monolayer portions 207, 208 may be under portions of selective conformal layer 112. Remaining blocking material portion 117 may be under gate 110 and/or under portions of selective conformal layer 112. In some examples, an undercut may be formed within remaining blocking material portion 117 during the removal of portions of blocking material 108.

Furthermore, although illustrated as relatively conformal layers, remaining self-assembled monolayer portions 207, 208 may be only trace amounts of self-assembled monolayer molecules attached or adhered to remaining blocking material portion 117, for example. In some examples, entire molecules of self-assembled monolayer molecules may remain. In other examples, only portions of molecules (e.g., head groups, tails, functional tail groups, or combinations thereof) may remain in remaining self-assembled monolayer portions 207, 208. The removed portions of blocking self-assembled monolayer 201 and blocking material 108 may be removed via any suitable technique or techniques. For example, portions of blocking material 108 may be removed via an etch process such as a wet etch process. As discussed, selective conformal layer 112 and blocking material 108 may have an etch selectivity therebetween such that an etch may be performed that removes portions of blocking material 108 while leaving selective conformal layer 112 substantially unaffected. For example, portions of blocking material 108 may be removed via a selective etch operation. In some examples, removed portions of blocking self-assembled monolayer 201 may be removed during the removal of portions of blocking material 108 using a lift-off technique for examples. In other examples, portions of blocking self-assembled monolayer 201 may be removed prior to the removal of portions of blocking material 108 using wet etch or other dissolution techniques.

Figure 2D:
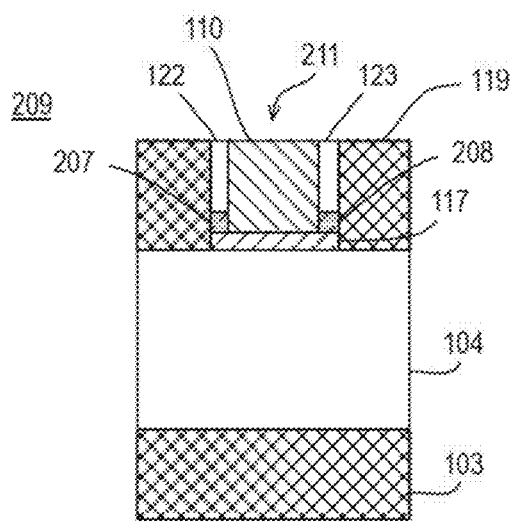

FIG. 2D illustrates a transistor structure 209 similar to transistor structure 205, after the formation of an optional interlayer dielectric material 119 and after the exposure of a top 211 of gate 110 and the formation of gate sidewall spacers 122, 123. In some examples, interlayer dielectric material 119 may be bulk deposited using any suitable technique or techniques over semiconductor fin 104, remaining blocking material portion 117, remaining self-assembled monolayer portions 207, 208, gate 110, and selective conformal layer 112 as discussed herein with respect to FIG. 1G. Interlayer dielectric material 119 may include any suitable dielectric material for providing electrical insulation between devices formed on or within device layer 103 for example. As shown, a portion of interlayer dielectric material 119 (e.g., if bulk deposited) and a top of selective conformal layer 112 may be removed. The portion of interlayer dielectric material 119 and the top of selective conformal layer 112 may be removed using any suitable technique or techniques such as, for example, chemical mechanical polish (CMP) techniques. Also as shown, gate sidewall spacers 122, 123 may be formed from remaining portions of selective conformal layer 112 after the removal of a top portion of selective conformal layer 112. As discussed with respect to FIGS. 1G and 1H, interlayer dielectric material 118 may not be utilized or an interlayer dielectric material may be provided later in the process flow. In such examples, top 121 of gate 110 may be exposed by removing a top of selective conformal layer 112 to form gate sidewall spacers 122, 123.

Figure 2E:
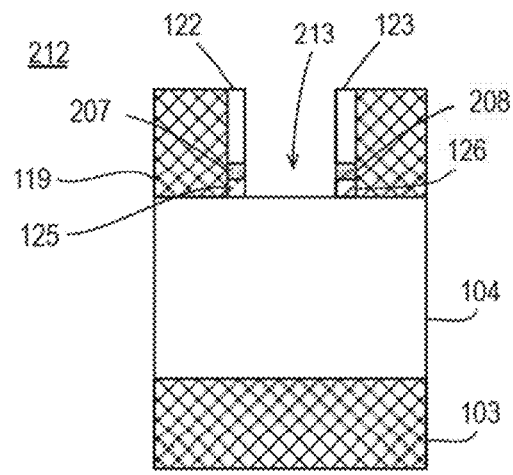

FIG. 2E illustrates a transistor structure 212 similar to transistor structure 209, after the removal of gate 110 and removal of a portion blocking material portion 117 adjacent to semiconductor fin 104 and between gate sidewall spacers 122, 123. As shown, gate 110 may be removed. In such examples, gate 110 may be a sacrificial gate or a dummy gate or the like. Furthermore, as shown, a portion blocking material portion 117 may be removed to leave remaining blocking material 125 and remaining blocking material 126 and to expose a region 213 of semiconductor fin 104. Gate 110 may be removed using any suitable technique or technique such as etch techniques or the like. Similarly, the portion blocking material portion 117 may be removed using any suitable technique or technique such as etch techniques or the like. In some examples, gate 110 may be removed in a first etch process and the portion blocking material portion 117 may be removed in a second etch process. In some examples, as is discussed further herein with respect to FIG. 4, an undercut may be formed within remaining blocking material 125 and/or remaining blocking material 126 during the removal of the portion blocking material portion 117.

Figure 2F:
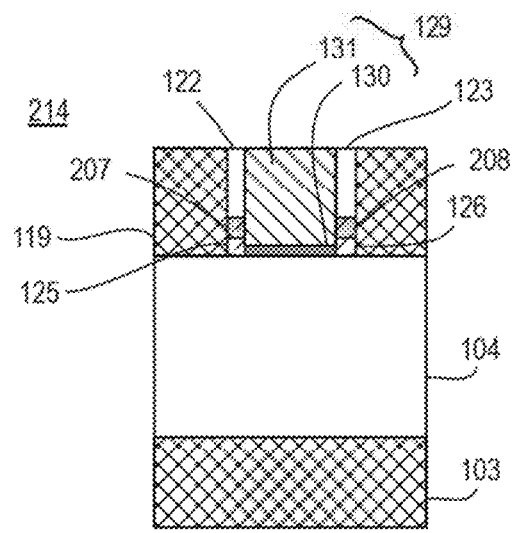

FIG. 2F illustrates a transistor structure 214 similar to transistor structure 212, after the formation of gate stack 129. As shown, gate stack 129 may be formed on semiconductor fin 104 and between gate sidewall spacers 122, 123. Gate stack 129 may include any suitable material or materials. For example, gate stack 129 may include a gate dielectric 130 such as a high-k gate dielectric and a gate electrode 131 such as a metal gate electrode. Gate stack 129 may be formed using any suitable technique or techniques such as conformal deposition, deposition, and CMP techniques or the like. As shown, in some examples, gate dielectric 130 may be formed on a surface of semiconductor fin 104. In other examples, gate dielectric 130 may also be formed on side surfaces of gate sidewall spacers 122, 123 such that gate electrode 131 is not in direct contact with gate sidewall spacers 122, 123 for example. As discussed, in some examples, gate stack 129 may wrap around three sides of semiconductor fin 104 (e.g., a top of semiconductor fin 104 as shown in FIG. 2E, and sides of semiconductor fin 104—please refer to the plan view of FIG. 1A). In some examples, gate stack 129 may wrap around all sides of semiconductor fin 104 such as in nanowire implementations.

Transistor structure 214 may form a portion of a transistor of an integrated circuit. for example, as is discussed further herein. For example, a transistor may include gate stack 129 (e.g. a gate) formed over a portion of semiconductor fin 104. The transistor may further include gate sidewall spacer 122 adjacent to the gate (e.g., adjacent to gate stack 129) and a blocking material (e.g., blocking material 125) between gate sidewall spacer 122 and another portion of semiconductor fin 104. Furthermore, the transistor may include a blocking self-assembled monolayer molecule head group, a blocking self-assembled monolayer molecule tail, a blocking self-assembled monolayer molecule tail functional group, a blocking self-assembled monolayer molecule, or a combination thereof (e.g., remaining self-assembled monolayer portion 207) between blocking material 125 and gate sidewall spacer 122. For example, carbon or carbon based chains portions from a self-assembled monolayer may be between blocking material 125 and gate sidewall spacer 122. Such a transistor structure or other transistor structures discussed herein may be implemented via a system, platform, computing device, or the like as is discussed further herein.

As discussed, FIGS. 2D-2F illustrate an example process flow for the formation of a transistor structure. In other embodiments, other fabrication operations may be performed on transistor structure 205 of FIG. 2C such as other replacement gate process flows or the like. For example, as discussed, a top of gate 110 may be exposed, sidewall spacers 122, 123 may be formed, and gate 110 may be removed without the introduction of interlayer dielectric 119. Furthermore, the formation of other structures such as channel implant regions, source/drain implant regions, and the like have not been discussed for the sake of clarity of presentation.

Figure 4:
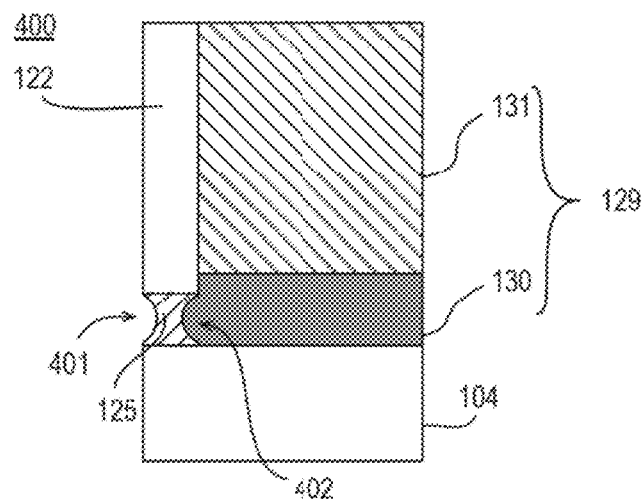
FIG. 4 illustrates an example transistor structure with a blocking material having undercuts.

FIG. 4 illustrates an example transistor structure 400 with a blocking material having undercuts, arranged in accordance with at least some implementations of the present disclosure. As discussed herein, in some examples, portions of a blocking material may be removed to leave a remaining blocking material portion 117 (e.g., please refer to FIGS. 1F and 2C). Furthermore, in some examples, a portion of blocking material portion 117 may be removed to expose a region of semiconductor fin 104 (e.g., please refer to FIGS. 1I and 2E) and to form remaining blocking material 125. In such examples, one or more undercuts may be formed in remaining blocking material 125. For example, as shown in FIG. 4, transistor structure 400 may include gate stack 129 (e.g., including gate dielectric 130 and gate electrode 131) disposed over a portion of semiconductor fin 104. Furthermore, transistor structure 400 may include blocking material 125 between gate sidewall spacer 122 and another portion of semiconductor fin 104.

As shown, in some examples, blocking material 125 may include undercut 401 and/or undercut 402. For example, undercut 401 may be formed during the removal of blocking material 108 to form blocking material portion 117 (e.g., please refer to FIGS. 1F and 2C). As discussed, such blocking material 108 may be removed via a selective wet etch process. For example, undercut 401 may be substantially rounded as shown due to an isotropic etch of blocking material 108. In some examples, blocking material 125 may include undercut 402. For example, undercut 402 may be formed during the removal of a portion of blocking material portion 117 to expose semiconductor fin 104 (e.g., please refer to FIGS. 1I and 2E). As discussed, such portion of blocking material portion 117 may be removed using a selective wet etch process. For example, undercut 402 may be substantially rounded as shown due to an isotropic etch of portion of blocking material portion 117 to form blocking material 125. As discussed, in various examples, only undercut 401, only undercut 402, both of undercuts 401, 402, or no undercuts may be formed in blocking material 125. Furthermore, in some examples, as discussed herein with respect to FIGS. 2A-2F, transistor structure 400 may include portions or entireties of self-assembled monolayer molecules between blocking material 125 and gate sidewall spacer 122. Also, as discussed, in some examples, semiconductor fin 104 may be implemented as a nanowire. In some examples, the nanowire may have a substantially circular cross section and, in such examples, undercut 401 and/or undercut 402 may include a ring around the nanowire structure.

Figure 5:
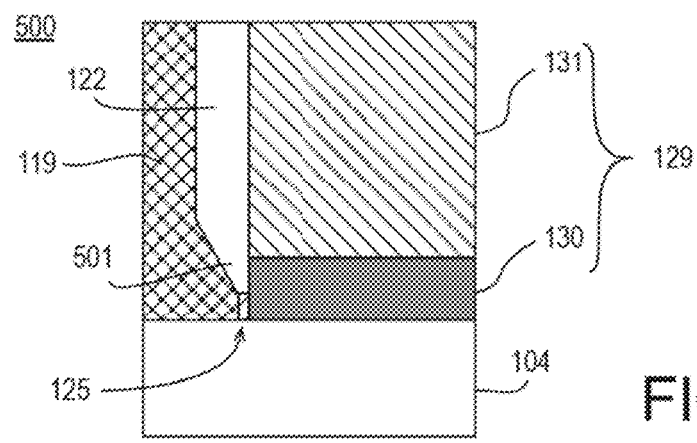
FIG. 5 illustrates an example transistor structure with a sidewall spacer having a tapered portion.

FIG. 5 illustrates an example transistor structure 500 with a sidewall spacer having a tapered portion, arranged in accordance with at least some implementations of the present disclosure. As discussed herein, in some examples, a conformal layer may be selectively formed on gate 110 but not on portions of blocking material 108 and/or blocking self-assembled monolayer 201 (e.g., please refer to FIGS. 1E and 2B), In some examples, a tapered portion or rounded portion may be formed in the conformal layer adjacent to semiconductor fin 104 such that the resultant gate sidewall spacers include such a tapered or rounded portion. For example, as shown in FIG. 5, transistor structure 500 may include gate stack 129 (e.g., including gate dielectric 130 and gate electrode 131) disposed over a portion of semiconductor fin 104. Furthermore, transistor structure 500 may include blocking material 125 between gate sidewall spacer 122 and another portion of semiconductor fin 104.

Also as shown, gate sidewall spacer 122 may include a tapered portion 501. For example, such a tapered portion 501 may be formed during the formation of selective conformal layer 112 due to a relatively high selectivity of growth between gate 110 and blocking material 108 and/or blocking self-assembled monolayer 201 (e.g., please refer to FIGS. 1E and 2B). For example, gate 110 may seed or provide growth for selective conformal layer 112 while blocking material 108 and/or blocking self-assembled monolayer 201 may resist the growth of selective conformal layer 112 causing tapered portion 501. As shown, in some examples, gate sidewall spacer 122 may include a tapered portion such as tapered portion 501. In other examples, gate sidewall spacer 122 may include a rounded portion, an undercut portion, or the like due to blocking material 108 and/or blocking self-assembled monolayer 201 resisting growth of selective conformal layer 112. As shown, such effects may cause a smaller blocking material 125 to be between gate sidewall spacer 122 and semiconductor fin 104. Furthermore, in some examples, as discussed herein with respect to FIGS. 2A-2F, transistor structure 500 may include portions or entireties of self-assembled monolayer molecules between blocking material 125 and gate sidewall spacer 122.

FIG. 6 illustrates an example transistor structure 600 with an implant region, arranged in accordance with at least some implementations of the present disclosure. As discussed herein, in some examples, an implant region may be formed in regions of semiconductor fin 104 (e.g., please refer to FIG. 1B). Such an implant region may be used to form, increase the depth of, or enhance the coverage of a subsequently formed blocking material (e.g., please refer to FIG. 1D). For example, an implant region may remain within blocking material 125 and/or portions of semiconductor fin 104. For example, as shown in FIG. 6, transistor structure 600 may include gate stack 129 (e.g., including gate dielectric 130 and gate electrode 131) disposed over a portion of semiconductor fin 104. Furthermore, transistor structure 600 may include blocking material 125 between gate sidewall spacer 122 and another portion of semiconductor fin 104. For example, a portion or an entirety of blocking material 125 may include an implant region and/or an implant species as discussed herein. Also as shown, transistor structure 600 may include an implant region 601 within semiconductor fin 104. Implant region 601 may be formed during an implant of sacrificial gate 110 for example. Implant region 601 may have any suitable depth, concentration and implant concentration profile. As discussed, in some examples, implant region 601 may include a nitrogen implant species. In other examples, implant region 601 may include one or more of silicon, argon, helium, xenon, oxygen, boron, phosphorus, arsenic, antimony or carbon. Furthermore, in some examples, as discussed herein with respect to FIGS. 2A-2F, transistor structure 600 may include portions or entireties of self-assembled monolayer molecules between blocking material 125 and gate sidewall spacer 122.

As shown in FIG. 6, in some examples, implant region 601 may comprises a substantially consistent implant region across semiconductor fin 104 that extends under gate sidewall spacer 122. In other examples, implant region 601 may not extend within semiconductor fin 104 and, in such examples, the implant region may be contained within blocking material 125.

Figure 7:
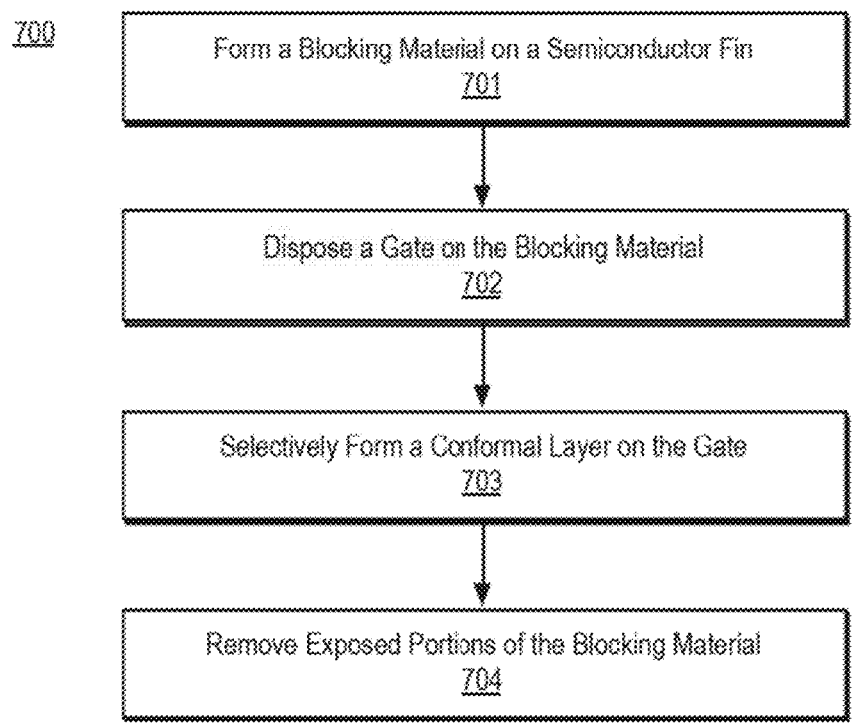
FIG. 7 is a flow diagram illustrating an example process for forming a device structure using a double patterning technique.

FIG. 7 is a flow diagram illustrating an example process for forming a transistor structure using selective gate spacer techniques, arranged in accordance with at least some implementations of the present disclosure. For example, method 700 may be implemented to fabricate transistor structures 128, 214, 400, 500, 600, or any other transistor structures as discussed herein. In the illustrated implementation, process 700 may include one or more operations as illustrated by operations 701-704. However, embodiments herein may include additional operations, certain operations being omitted, or operations being performed out of the order provided.

Method 700 may begin at operation 701, "Form a Blocking Material on a Semiconductor Fin", where a blocking material may be formed on a semiconductor fin. In an embodiment, blocking material 108 may be formed on semiconductor fin 104 as discussed herein with respect to FIG. 1B. For example the blocking material may include one or more of silicon oxide, silicon oxynitride, silicon nitride, silicon carbide, silicon oxycarbide, or a metal oxide such as aluminum oxide.

Method 700 may continue at operation 702, "Dispose a Gate on the Blocking Material", where a gate may disposed on at least a portion of the blocking material such that the gate and the blocking material comprise different surface chemistries as discussed herein. In an embodiment, gate 110 may be formed over blocking material 108 (and semiconductor fin 104) as discussed herein with respect to FIG. 1C. In some examples, as discussed herein, gate 110 may be a sacrificial or dummy gate such that a replacement gate process may be implemented.

Method 700 may continue at operation 703, "Selectively Form a Conformal Layer on the Gate", where a selective conformal layer may be formed on the gate such that the conformal layer has an etch selectivity with respect to the blocking material and such that the conformal layer is not formed on at least a portion of the blocking material. In an embodiment, selective conformal layer 112 may be formed on gate 110 as discussed herein with respect to FIG. 1E. In some examples, an optional implant region may be formed in gate 110 prior to forming selective conformal layer 112. In some examples, selective conformal layer 112 may be formed on gate 110 via an implant as discussed with respect to FIG. 1D. In some examples, a blocking self-assembled monolayer may be formed on the blocking material prior to forming the selective conformal layer as discussed herein with respect to FIGS. 2A and 2B. In an embodiment, blocking self-assembled monolayer 201 may be formed on a portion of blocking material 208 prior to forming selective conformal layer 112 as discussed herein.

Method 700 may continue at operation 704, "Remove Exposed Portions of the Blocking Material", where exposed portions of the blocking layer may be removed. For example, as discussed, the blocking material and the gate may have an etch selectivity therebetween such that exposed portions of the blocking material may be removed via a selective etch process. In an embodiment, portions of blocking material 108 may be removed to form remaining blocking material portion 117 as discussed herein with respect to FIG. 1F. In examples where a blocking self-assembled monolayer are implemented, exposed portions of the blocking self-assembled monolayer may also be removed as discussed herein with respect to FIG. 2C.

As discussed, in some examples, the gate formed at operation 702 may be a sacrificial or dummy gate. In such examples, a bulk dielectric may optionally be formed over the described structure and a planarization operation such as a chemical mechanical polish (CMP) operation may remove portions of the bulk dielectric and expose the sacrificial gate as well as form gate sidewall spacers (e.g., please refer to FIGS. 1H and 2D). The sacrificial gate may thereafter be removed and remaining portions of the blocking layer and/or the blocking self-assembled monolayer may be removed within the gate region (e.g., please refer to FIGS. 1I and 2E) leaving blocking material portions and/or self-assembled monolayer molecule portions or entireties thereof between the gate sidewall spacers and the semiconductor fin. Subsequently, a gate such as a high-k metal gate may be formed within the gate opening (e.g., please refer to FIGS. 1J and 2F). Such a transistor structure may be further processed to form source and drains, contacts to the gate and source/drains, and metal interconnects to form a transistor device such as an integrated circuit. As discussed herein, an interlayer dielectric (e.g., interlayer dielectric material 119) may be formed prior to exposing gate 110. In other examples, no such interlayer dielectric may be used.

As discussed, method 700 and other operations discussed herein may be implemented to fabricate transistor structures. Any one or more of the operations of method 700 (or the operations discussed herein with respect to FIGS. 1A-1J or FIGS. 2A-2F) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Furthermore, any one or more of the operations of method 700 (or the operations discussed herein with respect to FIGS. 1A-1J or FIGS. 2A-2F) may be undertaken to form a transistor structure, a transistor, or a device. For example, selective gate spacer techniques may be used to generate devices such as transistor devices, memory devices, or the like. For example, systems, apparatuses or devices may be formed that include a device layer such as a semiconductor substrate and one or more integrated circuit structures coupled to (e.g., on and/or within the semiconductor substrate) the semiconductor substrate such that the one or more integrated circuit structures are fabricated using techniques discussed herein.

For example, apparatuses or devices may be formed that include a device layer such as a semiconductor substrate and one or more integrated circuit structures coupled to the semiconductor substrate such that the one or more integrated circuit structures are fabricated by forming a blocking material on a semiconductor fin, disposing a gate on at least a first portion of the blocking material, wherein the gate and the blocking material comprise different surface chemistries, selectively forming a conformal layer on the gate, wherein the conformal layer has an etch selectivity with respect to the blocking material and wherein the conformal layer is not formed on at least a second portion of the blocking material, and removing exposed portions of the blocking material. Such integrated circuit structures may be further fabricated using any techniques discussed herein. For example, such integrated circuit structures may be integrated into platforms and/or computing devices as discussed herein with respect to FIGS. 8 and 9.

Figure 8:
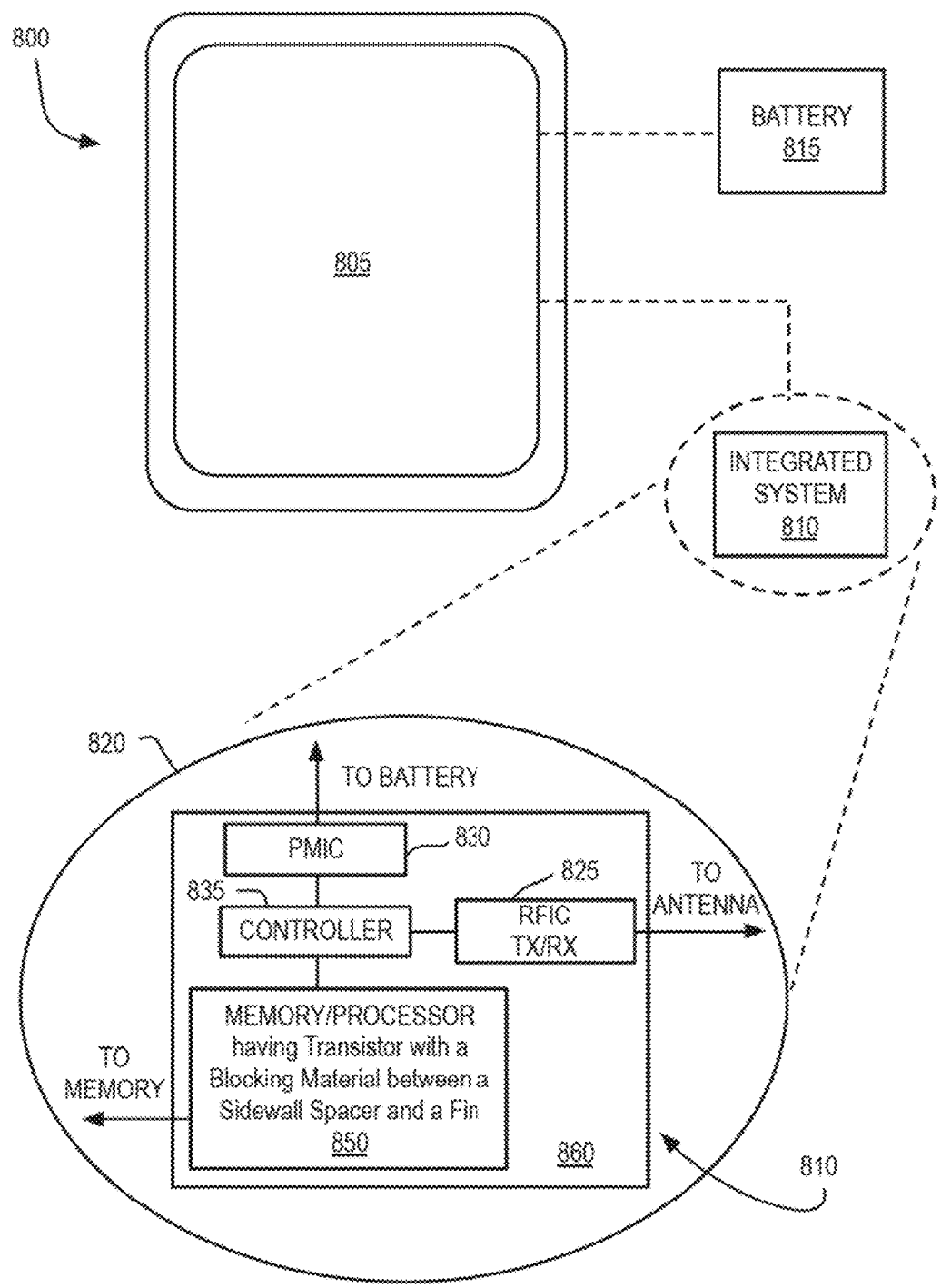
FIG. 8 is an illustrative diagram of a mobile computing platform employing an IC with transistor(s) fabricated via selective gate spacer techniques.

FIG. 8 is an illustrative diagram of a mobile computing platform 800 employing an IC with transistor(s) fabricated via selective gate spacer techniques, arranged in accordance with at least some implementations of the present disclosure. A transistor fabricated or formed via the selective gate spacer techniques discussed may be formed using any technique or techniques as discussed herein. Mobile computing platform 800 may be any portable device configured for each of electronic data display, electronic data processing, wireless electronic data transmission, or the like. For example, mobile computing platform 800 may be any of a tablet, a smart phone, a netbook, a laptop computer, etc. and may include a display screen 805, which in the exemplary embodiment is a touchscreen (e.g., capacitive, inductive, resistive, etc. touchscreen), a chip-level (SoC) or package-level integrated system 810, and a battery 815.

Integrated system 810 is further illustrated in the expanded view 820. In the exemplary embodiment, packaged device 850 (labeled "Memory/Processor" in FIG. 8) includes at least one memory chip (e.g., RAM), and/or at least one processor chip (e.g., a microprocessor, a multi-core microprocessor, or graphics processor, or the like). In an embodiment, the package device 850 is a microprocessor coupled to an SRAM cache memory. In some examples, one or both of the at least one memory and the at least one processor chip includes transistor(s) fabricated via the selective gate spacer techniques discussed herein. For example, a transistor of one or both of the processor or memory may include a gate disposed over at least a first portion of a semiconductor fin, a gate sidewall spacer adjacent to the gate, a blocking material between a second portion of the semiconductor fin and the gate spacer, wherein the gate sidewall spacer has an etch selectivity with respect to the blocking material, and/or other features as discussed herein. For example, the transistor may also include a blocking self-assembled monolayer molecule or a blocking self-assembled monolayer molecule portion (e.g., head group, tail, functional tail group, or a portion of a tail) between the blocking material and the gate sidewall spacer. Other example transistors may include an implant region within the semiconductor fin and under the blocking material.

Packaged device 850 may be further coupled to (e.g., communicatively coupled to) a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller thereof 835. In general, packaged device 850 may be also be coupled to (e.g., communicatively coupled to) display screen 805.

Functionally, PMIC 830 may perform battery power regulation, DC-to-DC conversion, etc., and so has an input coupled to battery 815 and with an output providing a current supply to other functional modules. In an embodiment, PMIC 830 may perform high voltage operations. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 850 or within a single IC (SoC) coupled to the package substrate of the packaged device 850.

Figure 9:
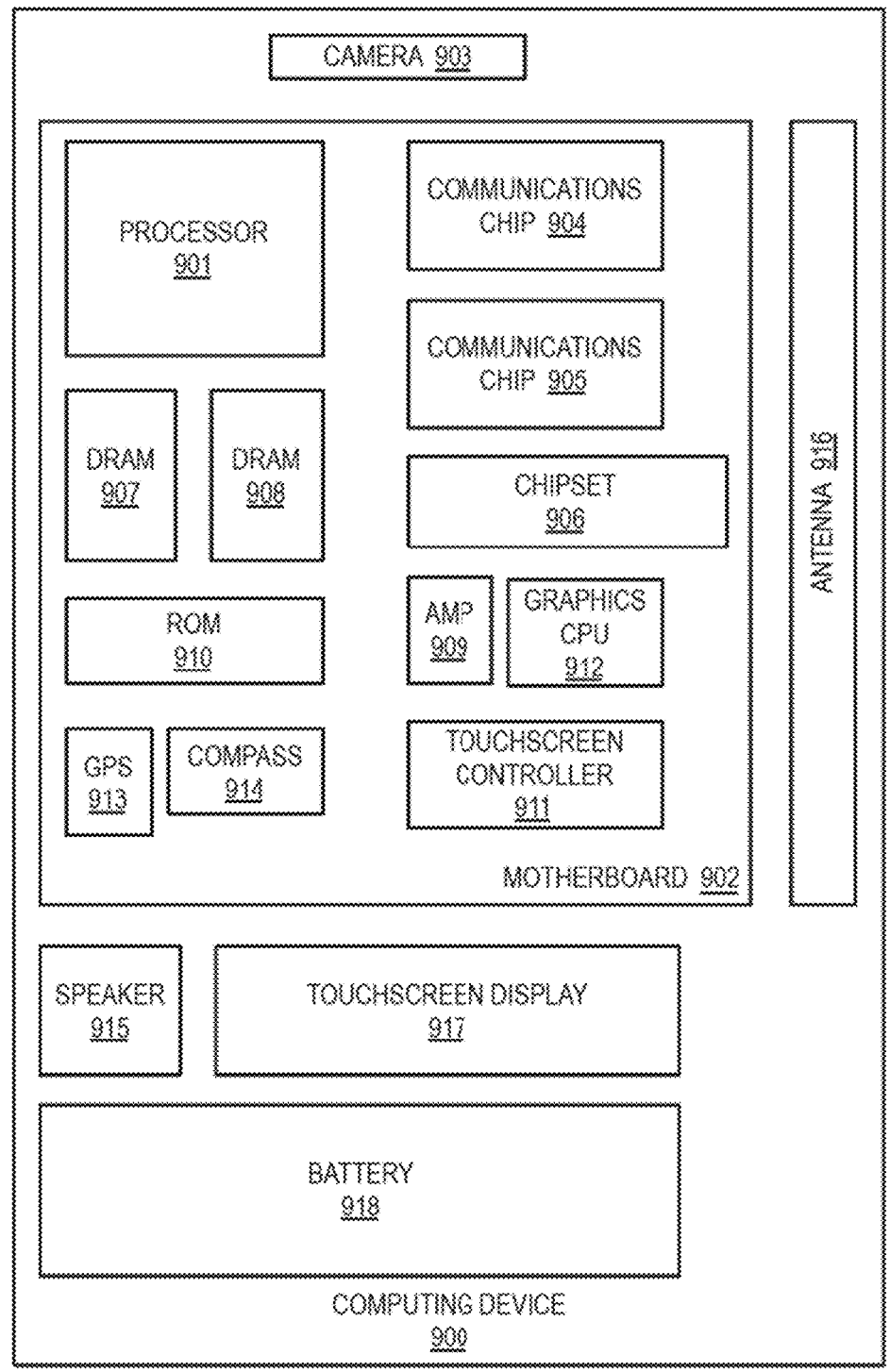
FIG. 9 is a functional block diagram of a computing device, all arranged in accordance with at least some implementations of the present disclosure.

FIG. 9 is a functional block diagram of a computing device 900, arranged in accordance with at least some implementations of the present disclosure. Computing device 900 may be found inside platform 1000, for example, and further includes a motherboard 902 hosting a number of components, such as but not limited to a processor 901 (e.g., an applications processor) and one or more communications chips 904, 905. Processor 901 may be physically and/or electrically coupled to motherboard 902. In some examples, processor 901 includes an integrated circuit die packaged within the processor 901. In general, the term "processor" may refer to any device or portion of a device that processes electronic data from registers and/or memory to transform that electronic data into other electronic data that may be stored in registers and/or memory.

In various examples, one or more communication chips 904, 905 may also be physically and/or electrically coupled to the motherboard 902. In further implementations, communication chips 904 may be part of processor 901. Depending on its applications, computing device 900 may include other components that may or may not be physically and electrically coupled to motherboard 902. These other components may include, but are not limited to, volatile memory (e.g., DRAM) 907, 908, non-volatile memory (e.g., ROM) 910, a graphics processor 912, flash memory, global positioning system (GPS) device 913, compass 914, a chipset 906, an antenna 916, a power amplifier 909, a touchscreen controller 911, a touchscreen display 917, a speaker 915, a camera 903, and a battery 918, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 904, 905 may enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 904, 905 may implement any of a number of wireless standards or protocols, including but not limited to those described elsewhere herein. As discussed, computing device 900 may include a plurality of communication chips 904, 905. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a method for fabricating a transistor comprises forming a blocking material on a semiconductor fin, disposing a gate on at least a first portion of the blocking material, wherein the gate and the blocking material comprise different surface chemistries, selectively forming a conformal layer on the gate, wherein the conformal layer has an etch selectivity with respect to the blocking material and wherein the conformal layer is not formed on at least a second portion of the blocking material, and removing exposed portions of the blocking material.

Further to the first embodiments, the method further comprises forming, prior to selectively forming the conformal layer, a blocking self-assembled monolayer on at least a portion of the blocking material.

Further to the first embodiments, the method further comprises forming, prior to selectively forming the conformal layer, a blocking self-assembled monolayer on at least a portion of the blocking material, wherein the blocking self-assembled monolayer comprises molecules having at least head groups and tails, wherein the head groups comprise at least one of a siloxane, a silyl chloride, an alkene, an alkyne, an amine, a phosphine, a thiol, a phosphonic acid, or a carboxylic acid.

Further to the first embodiments, the method further comprises performing, prior to selectively forming the conformal layer on the gate, an implant into the gate to form an implant region within the gate.

Further to the first embodiments, performing, prior to selectively forming the conformal layer on the gate, an implant into the gate to form an implant region within the gate, wherein the gate comprises polysilicon, the implant comprises a nitrogen implant, and the blocking material comprises silicon oxide.

Further to the first embodiments, performing, prior to selectively forming the conformal layer on the gate, an implant into the gate to form an implant region within the gate, wherein the gate comprises polysilicon, the implant comprises an amorphization implant, and selectively forming the conformal layer comprises a carbon deposition and rapid thermal processing to form a silicon carbide conformal layer.

Further to the first embodiments, the method further comprises forming, prior to selectively forming the conformal layer, a blocking self-assembled monolayer on at least a portion of the blocking material and/or performing, prior to selectively forming the conformal layer on the gate, an implant into the gate to form an implant region within the gate.

Further to the first embodiments, selectively forming the conformal layer on the gate comprises a single deposition operation comprising at least one of a plasma exposure, an atomic layer deposition, a molecular layer deposition, or a chemical vapor deposition.

Further to the first embodiments, selectively forming the conformal layer on the gate comprises performing an implant into the gate to form the conformal layer.

Further to the first embodiments, the blocking material comprises at least one of silicon oxide, silicon oxynitride, silicon nitride, silicon carbide, silicon oxycarbide, or aluminum oxide.

Further to the first embodiments, the conformal layer comprises at least one of silicon oxide, silicon nitride, silicon oxynitride, silicon carbide, silicon oxycarbide, boron nitride, boron carbide, boron carbonitride, boron phosphide, boron sulfide, polyphosphazene, or aluminum oxide.

Further to the first embodiments, wherein the gate comprises a sacrificial gate and the method further comprises removing a top portion of the conformal layer to expose the gate and to form gate sidewall spacers from remaining portions of the conformal layer, removing the gate and at least a portion of the blocking material adjacent to the semiconductor fin and between the gate sidewall spacers, and disposing a gate stack on the semiconductor fin and between the gate sidewall spacers.

Further to the first embodiments, the semiconductor fin comprises an undercut fin comprising a nanowire and the gate substantially wraps around the semiconductor fin.

In one or more second embodiments, an integrated circuit comprising a transistor includes a gate disposed over at least a first portion of a semiconductor fin, a gate sidewall spacer adjacent to the gate, and a blocking material between a second portion of the semiconductor fin and the gate spacer, wherein the gate sidewall spacer has an etch selectivity with respect to the blocking material.

Further to the second embodiments, the integrated circuit further comprises a blocking self-assembled monolayer molecule head group between the blocking material and the gate sidewall spacer.

Further to the second embodiments, the integrated circuit further comprises a blocking self-assembled monolayer molecule head group between the blocking material and the gate sidewall spacer, wherein the blocking self-assembled monolayer molecule head group comprises at least one of a siloxane, a silyl chloride, an alkene, an alkyne, an amine, a phosphine, a thiol, a phosphonic acid, or a carboxylic acid.

Further to the second embodiments, the integrated circuit further comprises a blocking self-assembled monolayer molecule head group between the blocking material and the gate sidewall spacer, wherein the blocking self-assembled monolayer molecule head group comprises at least one of a siloxane, a silyl chloride, an alkene, an alkyne, an amine, a phosphine, a thiol, a phosphonic acid, or a carboxylic acid, and an implant region within the semiconductor fin and under at least the blocking material.

Further to the second embodiments, the integrated circuit further comprises a blocking self-assembled monolayer molecule head group between the blocking material and the gate sidewall spacer, wherein the blocking self-assembled monolayer molecule head group comprises at least one of a siloxane, a silyl chloride, an alkene, an alkyne, an amine, a phosphine, a thiol, a phosphonic acid, or a carboxylic acid, and an implant region within the semiconductor fin and under at least the blocking material, wherein the implant region comprises at least one of nitrogen, oxygen, boron, phosphorus, arsenic, antimony, carbon, argon, helium, or xenon.

Further to the second embodiments, the integrated circuit further comprises at least one of a blocking self-assembled monolayer molecule head group or a blocking self-assembled monolayer molecule tail between the blocking material and the gate sidewall spacer and/or an implant region within the semiconductor fin and under at least the blocking material.

Further to the second embodiments, the blocking material comprises silicon oxide, the gate sidewall spacer comprises silicon nitride, the gate comprises a gate stack including a high-k gate dielectric and a metal gate on the high-k gate dielectric.

Further to the second embodiments, the blocking material comprises at least one of silicon oxide, silicon oxynitride, silicon nitride, silicon carbide, silicon oxycarbide, or aluminum oxide, and wherein the integrated circuit further comprises an undercut portion under the gate sidewall spacer.

Further to the second embodiments, the gate sidewall spacer comprises at least one of silicon oxide, silicon, nitride, silicon oxynitride, silicon carbide, silicon oxycarbide, boron nitride, boron carbide, boron carbonitride, boron phosphide, boron sulfide, polyphosphazene, or aluminum oxide, and wherein the gate sidewall spacer comprises a tapered portion adjacent to the semiconductor fin.

Further to the second embodiments, the blocking material comprises at least one of silicon oxide, silicon oxynitride, silicon nitride, silicon carbide, silicon oxycarbide, or aluminum oxide and/or the gate sidewall spacer comprises at least one of silicon oxide, silicon, nitride, silicon oxynitride, silicon carbide, silicon oxycarbide, boron nitride, boron carbide, boron carbonitride, boron phosphide, boron sulfide, polyphosphazene, or aluminum oxide.

Further to the second embodiments, the integrated circuit further comprises an undercut portion under the gate sidewall spacer and/or the gate sidewall spacer comprises a tapered portion adjacent to the semiconductor fin.

Further to the second embodiments, the semiconductor fin comprises an undercut fin comprising a nanowire and the gate substantially wraps around the semiconductor fin.

In one or more third embodiments, a system comprises a memory and a processor coupled to the memory, the processor comprising a transistor including a gate disposed over at least a first portion of a semiconductor fin, a gate sidewall spacer adjacent to the gate, and a blocking material between a second portion of the semiconductor fin and the gate spacer, wherein the gate sidewall spacer has an etch selectivity with respect to the blocking material.

Further to the third embodiments, the transistor further comprises a blocking self-assembled monolayer molecule head group between the blocking material and the gate sidewall spacer, wherein the blocking self-assembled monolayer molecule head group comprises at least one of a siloxane, a silyl chloride, an alkene, an alkyne, an amine, a phosphine, a thiol, a phosphonic acid, or a carboxylic acid.

Further to the third embodiments, the transistor further comprises an implant region within the semiconductor fin and under at least the blocking material.

Further to the third embodiments, the blocking material comprises silicon oxide, the gate sidewall spacer comprises silicon nitride, and the gate comprises a gate stack including a high-k gate dielectric and a metal gate on the high-k gate dielectric.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor comprising:
   a gate comprising a gate dielectric over a first portion of a semiconductor fin and a gate electrode over the gate dielectric;
   a blocking material on a second portion of the semiconductor fin adjacent the first portion, the blocking material comprising silicon, carbon, and nitrogen;
   an interlayer dielectric material on a third portion of the semiconductor fin adjacent to the second portion; and
   a gate sidewall spacer on the blocking material and adjacent the gate, wherein the blocking material and the gate sidewall spacer are adjacent to the interlayer dielectric material and between the gate and the interlayer dielectric material.

2. The transistor of claim 1, further comprising:
   an implant region within the semiconductor fin and under at least the blocking material.

3. The transistor of claim 2, wherein the implant region comprises at least one of nitrogen, oxygen, boron, phosphorus, arsenic, antimony, carbon, argon, helium, or xenon.

4. The transistor of claim 1, wherein the gate sidewall spacer comprises silicon and nitrogen, the gate dielectric comprises a high-k gate dielectric and the gate electrode comprises a metal gate.

5. The transistor of claim 1, wherein the blocking material comprises at least one of silicon oxide, silicon oxynitride, silicon nitride, silicon carbide, silicon oxycarbide, or aluminum oxide.

6. The transistor of claim 5, further comprising an undercut portion under the gate sidewall spacer.

7. The transistor of claim 1, wherein the gate sidewall spacer comprises at least one of silicon oxide, silicon, nitride, silicon oxynitride, silicon carbide, silicon oxycarbide, boron nitride, boron carbide, boron carbonitride, boron phosphide, boron sulfide, polyphosphazene, or aluminum oxide, and wherein the gate sidewall spacer comprises a tapered portion adjacent to the semiconductor fin.

8. The transistor of claim 1, wherein the semiconductor fin comprises an undercut fin comprising a nanowire and the gate substantially wraps around the semiconductor fin.

9. A system comprising:
   a memory; and
   a processor coupled to the memory, the processor comprising a transistor comprising:
     a gate comprising a gate dielectric over a first portion of a semiconductor fin and a gate electrode over the gate dielectric;
     a blocking material on a second portion of the semiconductor fin adjacent the first portion, the blocking material comprising silicon, carbon, and nitrogen;
     an interlayer dielectric material on a third portion of the semiconductor fin adjacent to the second portion; and
     a gate sidewall spacer on the blocking material and adjacent the gate, wherein the blocking material and the gate sidewall spacer are adjacent to the interlayer dielectric material and between the gate and the interlayer dielectric material.

10. The system of claim 9, further comprising:
    an implant region within the semiconductor fin and under at least the blocking material.

11. The system of claim 10, wherein the implant region comprises at least one of nitrogen, oxygen, boron, phosphorus, arsenic, antimony, carbon, argon, helium, or xenon.

12. The system of claim 9, wherein the gate sidewall spacer comprises silicon and nitrogen, the gate dielectric comprises a high-k gate dielectric and the gate electrode comprises a metal gate.

13. The system of claim 9, wherein the blocking material comprises at least one of silicon oxide, silicon oxynitride, silicon nitride, silicon carbide, silicon oxycarbide, or aluminum oxide.

14. The system of claim 13, wherein the transistor further comprises an undercut portion under the gate sidewall spacer.

15. The system of claim 9, wherein the gate sidewall spacer comprises at least one of silicon oxide, silicon, nitride, silicon oxynitride, silicon carbide, silicon oxycarbide, boron nitride, boron carbide, boron carbonitride, boron phosphide, boron sulfide, polyphosphazene, or aluminum oxide, and wherein the gate sidewall spacer comprises a tapered portion adjacent to the semiconductor fin.

16. The system of claim 9, wherein the semiconductor fin comprises an undercut fin comprising a nanowire and the gate substantially wraps around the semiconductor fin.

* * * * *